US007957545B2

(12) United States Patent
Kim et al.

(10) Patent No.: US 7,957,545 B2
(45) Date of Patent: Jun. 7, 2011

(54) STEREO SPEAKER SYSTEM HAVING ACOUSTIC FILTER FOR IMPROVING LOW FREQUENCY CHARACTERISTIC

(75) Inventors: Young Tae Kim, Seongnam-si (KR); Jung Ho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1561 days.

(21) Appl. No.: 11/316,860

(22) Filed: Dec. 27, 2005

(65) Prior Publication Data

US 2007/0025565 A1 Feb. 1, 2007

(30) Foreign Application Priority Data

Jul. 28, 2005 (KR) ........................ 10-2005-0068998

(51) Int. Cl.
*H03G 5/00* (2006.01)
*H04R 5/00* (2006.01)
*H04R 1/02* (2006.01)
*H04B 7/00* (2006.01)
*H04M 1/00* (2006.01)

(52) U.S. Cl. ........... 381/98; 381/1; 381/335; 455/569.1; 455/575.1; 455/41.2; 455/41.3

(58) Field of Classification Search ................ 381/1, 98, 381/335, 17–19; 455/569.1, 575.1, 41.2, 455/41.3
See application file for complete search history.

(56) References Cited

U.S. PATENT DOCUMENTS 4,424,416 A 1/1984 Fukuoka ......................... 381/24
7,346,315 B2 * 3/2008 Zurek et al. .................. 455/90.3

FOREIGN PATENT DOCUMENTS

| | | |
|---|---|---|
| EP | 0 333 133 | 9/1989 |
| JP | 01-218298 | 8/1989 |
| JP | 11-234781 | 8/1999 |
| JP | 2000-92177 | 3/2000 |
| JP | 2000-156895 | 6/2000 |
| JP | 2003-158565 | 5/2003 |
| KR | 20-1999-0041565 | 12/1999 |
| KR | 10-2004-0032028 | 4/2004 |

* cited by examiner

*Primary Examiner* — Devona E Faulk
(74) *Attorney, Agent, or Firm* — Staas & Halsey LLP

(57) ABSTRACT

A stereo speaker system including: a speaker unit having a plurality of speakers which output audio; and a filter unit selectively receiving low frequency components of the outputted audio. The filter unit eliminates the received low frequency components to decrease back pressure on the speakers. Thus, the phenomenon of air-loading caused by back-pressure is removed and the low frequency characteristic of stereo speakers is improved by activating the vibration of a vibrating plate.

3 Claims, 4 Drawing Sheets i)

ii)

i)

ii)

i)

ii)

STEREO SPEAKER SYSTEM HAVING ACOUSTIC FILTER FOR IMPROVING LOW FREQUENCY CHARACTERISTIC

CROSS-REFERENCE TO RELATED APPLICATION

This application claims the benefit of Korean Patent Application No. 10-2005-68998, filed on Jul. 28, 2005, in the Korean Intellectual Property Office, the disclosure of which is incorporated herein by reference.

BACKGROUND OF THE INVENTION

1. Field of the Invention

The present invention relates to a stereo speaker system in which an acoustic filter is located between stereo speakers that cannot secure a sufficient volume of a rear cavity and connects between the stereo speakers to eliminate low frequency components outputted from the both speakers in the acoustic filter, thereby removing an air loading phenomenon caused by back-pressure and smoothly vibrating a vibrating plate to improve low frequency characteristic of stereo speakers.

2. Description of Related Art

It is increasingly common that various types of multimedia are replayed using a mobile communication terminal, and a speaker installed in a mobile communication terminal is rapidly being replaced by stereo speakers. When an MP3 is replayed by an MP3 phone or a broadcasting program is replayed by a DMB phone, stereo speakers provide an effect of replaying clearer and active audio.

A mobile communication terminal including stereo speakers secures a sufficient size rear cavity, thereby replaying low frequency audio with improved quality from the stereo speakers.

Currently, the size of a mobile communication terminal is reduced as much as possible so that a user easily carries the mobile communication terminal. Accordingly, when the stereo speakers are installed in a mobile communication terminal that becomes too slim, the mobile communication terminal cannot secure a sufficient volume of a rear cavity to guarantee the quality of low frequency audio replayed from stereo speakers. Stated another way, slim mobile communication terminals often have difficulty reproducing low frequency tones with great fidelity.

Particularly, in the case the volume of a rear cavity cannot be secured, the quality of low frequency audio is notably deteriorated due to back-pressure with respect to the stereo speakers in the case the low frequency audio is replayed on the stereo speakers.

To solve the problems, a method is worked out, in which an absorber is located between stereo speakers to absorb low frequency components of audio occurring in replaying low frequency audio and to control occurrence of the back-pressure. However, since an absorber can absorb low frequency components of specific frequency, there may be a trouble to continuously change an absorber corresponding to a low frequency component to be absorbed in order to absorb various low frequency components.

Accordingly, a model of stereo speakers of a new concept is acutely required, in which back-pressure with respect to stereo speakers can be controlled to improve low frequency characteristic of the stereo speakers in the case the low-pitched sound is outputted from stereo speakers not capable of securing a sufficient rear cavity.

BRIEF SUMMARY

An aspect of the present invention provides a stereo speaker system in which low frequency components of audio may be eliminated via an offset process in an acoustic filter and low frequency sound characteristics of the stereo speakers can be improved via controlling generated back-pressure.

An aspect of the present invention also provides frequency components of audio is determined based on resonance frequency of audio outputted from stereo speakers, thereby stably receiving low frequency components whose frequency size is changed from the filter.

According to an aspect of the present invention, there is provided a stereo speaker system including: a speaker unit having a plurality of speakers which output audio; and a filter unit selectively receiving low frequency components of the outputted audio, wherein the filter unit eliminates the received low frequency components to decrease back pressure on the speakers.

The filter unit may receive a first low frequency component from a first speaker, receive a second low frequency component, and offset the first low frequency component and the second low frequency component to eliminate the low frequency component of the audio.

The filter unit may be an orifice tube that is located to connect between the plurality of speakers.

The diameter and the volume of the orifice tube may be determined based on resonance frequency of the audio.

According to another aspect of the present invention, there is provided a method of improving a low frequency characteristic, including: outputting an audio signal via a plurality of speakers; selectively receiving a first low frequency component from one of the plurality of speakers and a second low frequency component from another of the plurality of speakers; and eliminating the received low frequency components by offsetting the first low frequency component and the second low frequency component.

According to another aspect of the present invention, there is provided a speaker system, including: first and second speakers separated by a predetermined distance; and a filter unit connecting the speakers and offsetting a first low frequency component from the first speaker and a second low frequency component from the second speaker so as to reduce the back-pressure on the speakers.

Additional and/or other aspects and advantages of the present invention will be set forth in part in the description which follows and, in part, will be obvious from the description, or may be learned by practice of the invention.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EMBODIMENTS

Figure 1:
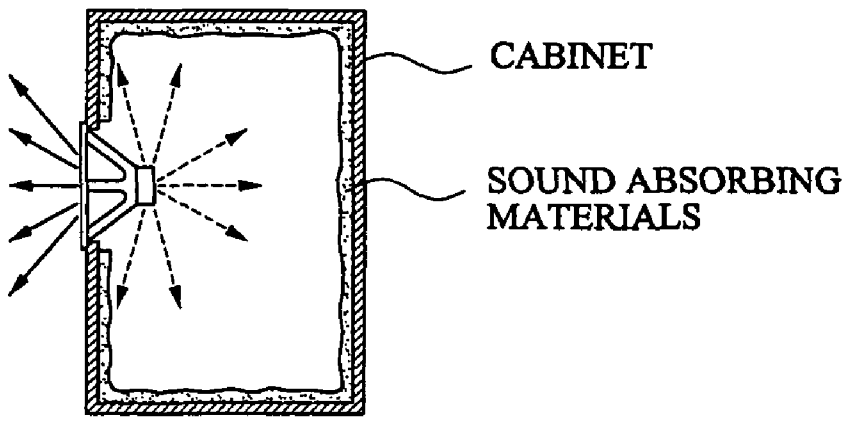
FIG. 1 (CONVENTIONAL ART)
FIG. 1, parts i) and ii), is a diagram schematically illustrating a rear cavity of a general speaker.
Figure 1:
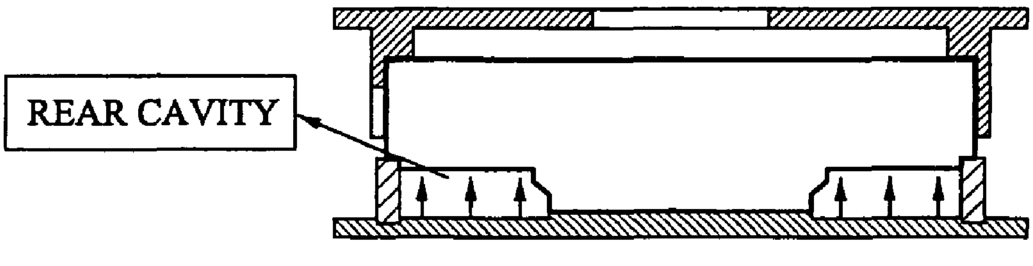
FIG. 1 (CONVENTIONAL ART)

Reference will now be made in detail to embodiments of the present invention, examples of which are illustrated in the accompanying drawings, wherein like reference numerals refer to the like elements throughout. The embodiments are described below in order to explain the present invention by referring to the figures FIG. 1 is a diagram schematically illustrating a rear cavity of a conventional general speaker.

A general speaker for outputting audio outputs a part of the audio in a direction of the rear surface of a vibrating plate, which is opposite to a direction of the front surface of the vibrating plate, which is a basic output direction of the audio. The vibrating plate vibrated by electric power of a voice coil based on a theory of outputting audio can not transmit vibrating force in only the basic output direction, air pressure is changed in not only the front surface but also the rear surface of the vibrating plate to be outputting audio.

The audio outputted from the rear surface of the vibrating plate may disturb the vibration of the vibrating plate to weaken the vibrating force. Particularly, resonance frequency (frequency of outputting audio) belongs to a low frequency band, the vibrating force of the vibrating plate is limited by increasing air loading quantity by the back pressure. Accordingly, there occurs a problem of deteriorating the quality of audio when low frequency audio is outputted from a general speaker for outputting audio.

To improve this, in a general speaker for outputting audio shown in part i) of FIG. 1, a sufficient space for the rear surface of the vibrating plate is sealed by a cabinet, thereby keeping the audio outputted from the rear surface of the vibrating plate in the cabinet. Also, an absorber material is applied to the inside of the cabinet, thereby absorbing the audio kept in the cabinet by the absorbing material and controlling the occurrence of the back-pressure.

Also, in case that an installation space of the cabinet sealing the rear surface of the vibrating plate is limited, different from a general speaker for outputting stereo audio, for example, since a speaker is installed in a mobile communication terminal manufactured for being portable, a rear cavity installation space that functions similar to the cabinet is not sufficient (refer to part ii) of FIG. 1). In this case, a rear cavity resonates at a certain frequency, thereby eliminating back pressure caused by the audio outputted from the rear surface of the vibrating plate.

In part ii) of FIG. 1, a space between the rear surface of the vibrating plate and a case of a mobile communication terminal is secured as a rear cavity. A plurality of audio outputted into the rear cavity control the occurrence of the back-pressure to the vibrating plate by maximizing amplitude at a position in which the value of the frequency is the same. For this, the volume of the rear cavity, namely, the size of a space of the rear cavity has to be a certain size, and the occurrence of the back-pressure may be easily controlled when the volume is large.

However, recently, as a mobile communication terminal becomes slimed down, the size of a mobile communication terminal itself is decreased, so there is a lack of a space for a rear cavity. Accordingly, in the case a mobile communication terminal equipped with stereo speakers not securing a sufficient volume of a rear cavity, particularly, in audio resonance frequency in a low frequency band, the occurrence of the back-pressure with respect to the vibrating plate of a speaker is not controlled and low frequency sound characteristic of stereo speakers is notably dropped due to an increase of air-loading.

Figure 2:
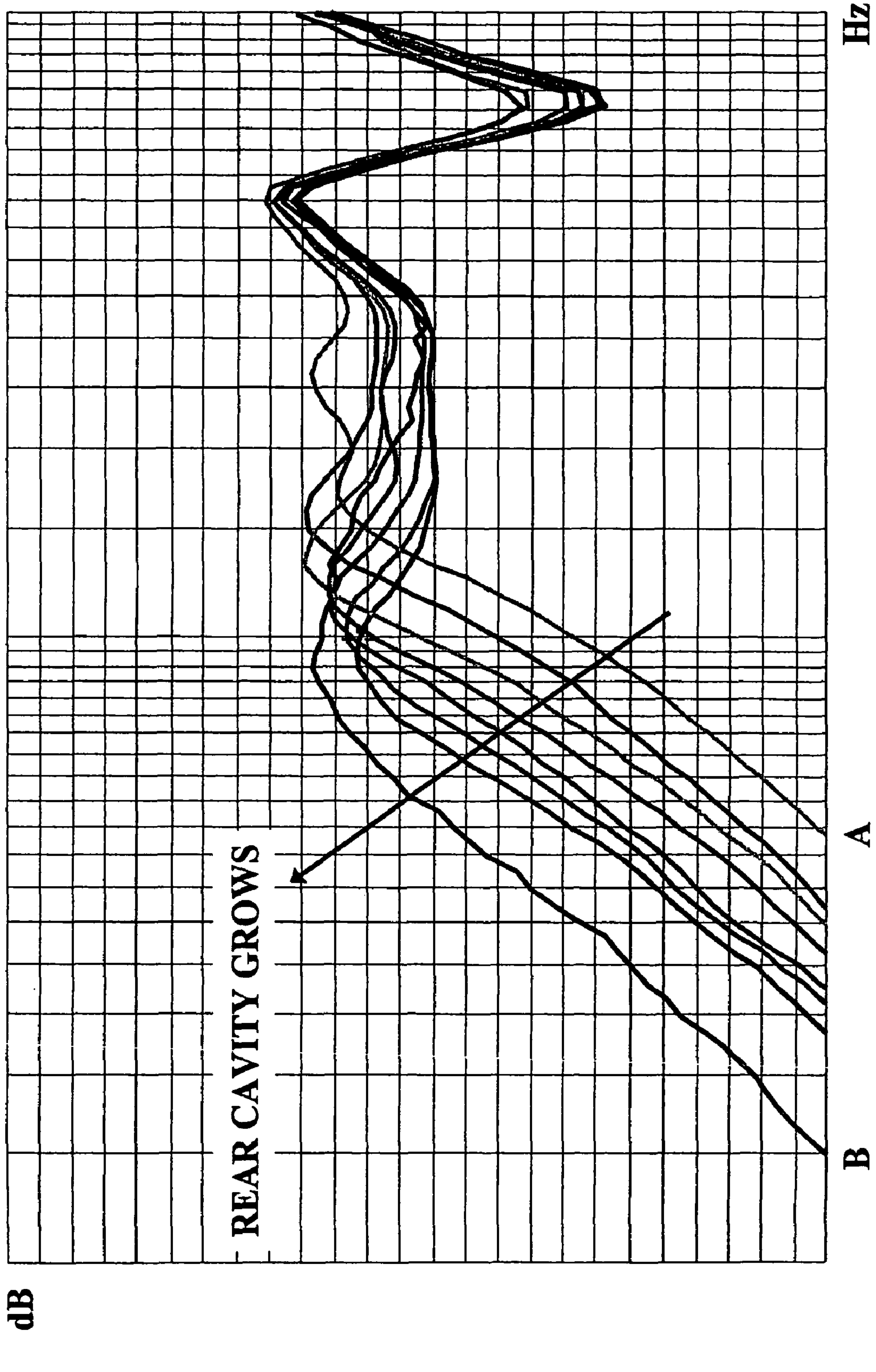
FIG. 2 is a diagram illustrating a curved line of the characteristic of audio according to an increase/decrease of the rear cavity.

FIG. 2 is a diagram illustrating a curved line of the characteristic of audio according to an increase/decrease of a rear cavity.

Referring to FIG. 2, characteristic curves indicate a replay frequency (Hz) with respect to a horizontal axis and indicate a value of sequentially measuring decibel level (dB) of audio with respect to a vertical axis. In this case, a frequency indicated by a peak of the audio characteristic curve may indicate a resonance frequency at which audio is outputted from a speaker. The higher the resonance frequency is, the higher frequency sound of audio is outputted from a speaker. Also, the lower the resonance frequency is, the lower frequency sound of audio is outputted from the speaker.

When the resonance frequency of audio is a high-frequency band, a characteristic curve A outputted by a speaker securing the smallest rear cavity indicates that the decibel level of the outputted audio is normally kept, and it is known by the characteristic curve A that a high-pitched sound process is performed with no trouble in the speaker.

However, as illustrated in FIG. 2, by a speaker associated with a characteristic curve A, in the case a replay frequency of audio becomes lower, the decibel level of the audio is rapidly decreased and the quality of low frequency sound of the audio is deteriorated. Namely, in the case a speaker that cannot sufficiently secure the rear cavity, back-pressure is increased with respect to a vibrating plate of the speaker and vibrating force of the vibrating plate and the decibel level of outputted audio is rapidly decreased.

On the other hand, by a speaker associated with a characteristic curve B, the decibel level of audio is slowly decreased in case that a replay frequency of audio becomes lower. Accordingly the decibel level of the audio is kept as a predetermined level in a low frequency band and low frequency sound is continuously performed. Namely, a speaker sufficiently securing the volume of a rear cavity may keep an excellent low frequency sound characteristic by controlling rapid increase of back-pressure even if resonance frequency of the audio decreases. Also, as illustrated in FIG. 2, though the replay frequency of audio belongs to a high-frequency band, the speaker associated with the characteristic curve B shows a similar pattern with the characteristic curve A capable of processing relatively excellent high-pitched sound, thereby easily performing high-pitched sound.

Accordingly, when stereo speakers are performing a low frequency sound process, though it is an important point to secure a large rear cavity, and when the rear cavity is not sufficiently secured due to the condition of manufacturing a mobile communication terminal equipped with stereo speakers, the low frequency sound characteristic of a speaker may be improved by eliminating audio outputted from a rear surface of a vibrating plate, and particularly, low frequency components of the audio.

When stereo speakers are installed in a slim type mobile communication terminal that cannot sufficiently secure a rear cavity, the stereo speaker system according to an embodiment of the present invention may improve low frequency sound characteristic of stereo speakers by eliminating low frequency components of audio outputted from a rear surface of a vibrating plate.

For this, the stereo speaker system of an embodiment of the present invention may include an acoustic filter capable of eliminating low frequency components of the audio and control the elimination of the low frequency components by the acoustic filter and the occurrence of back-pressure according to the elimination.

Hereinafter, the configuration of a stereo speaker system 300 according to an embodiment of the present invention will be described in detail with reference to FIG. 3.

The stereo speaker system 300 of the present embodiment includes a speaker unit 310 and a filter unit 320.

The speaker unit 310 is equipped with a respective first and second speakers 312 and 314 outputting audio. The first speaker 312 is separated from the second speaker 314 by a predetermined distance. The speaker unit 310 attaches to a mobile communication terminal.

In this case, a mobile communication terminal may indicate a structure body having a profile slimmed down to not sufficiently secure the rear cavity of the speakers 312 and 314, for example, mobile phones designed for portability and having strengthened multimedia functions such as MP3 phones and DMB phones, PCS, and also digital cameras, camcorders, notebooks, and electronic dictionaries.

The speakers 312 and 314 installed in the speaker unit 310 output a plurality of audio at a set-up resonance frequency, thereby providing stereo audio service to a user who sets up the resonance frequency. Particularly, a first low frequency component of audio outputted from the rear surface of a vibrating plate of the first speaker and a second low frequency component of audio outputted from the rear surface of the second speaker 314 may be eliminated due to an offset function.

The filter unit 320 connects the first speaker 312 with the second speaker 314 and offsets the first low frequency component and the second low frequency component respectively received from the first speaker 312 and the second speaker 314, thereby reducing the back-pressure with respect to the first speaker 312 and the second speaker 314.

In this case, the filter unit 320 is an acoustic filter in the shape of an orifice type tube. The acoustic filter is connected between the speakers 312 and 314 of the speaker unit 310 and may be attached to a mobile communication terminal. Namely, the filter unit 320 receives the first low frequency component or the second low frequency component via an inlet of a filter and induces the elimination of the first and second low frequency components by the offset function between the low frequency components.

Also, the structure of the acoustic filter or various characteristic such as diameter and volume may be determined based on a resonance frequency of audio outputted from the stereo speakers 312 and 314. Namely, the structure of the acoustic filter or various characteristics such as the diameter and volume may be determined according to the resonance frequency that a developer wants.

For example, the diameter of the orifice tube may be proportionally extended accordingly as the resonance frequency of the audio outputted from the speakers 312 and 314 is increased. Because the frequency of the low component of the audio may be proportionally increased in the case the resonance frequency is increased and the diameter of the filter unit 320 has to be extended in order to stably receive the low frequency components whose frequency is increased.

On the other hand, when a resonance frequency that the developer wants is increased more than before due to changing the characteristic of the filter unit 320, there may be another example that low frequency components whose frequency is increased are flexibly received by reducing the size of the diameter of the filter unit 320.

The speakers 312 and 314 increase the vibrating force of the vibrating plate associated with the output of the audio in low frequency band, according to a decrease of the back-pressure.

Accordingly, according to the present embodiment, though stereo speakers are installed in a mobile communication terminal too slim to secure a sufficient rear cavity, low frequency components of audio may be eliminated and an air-loading phenomenon caused by the back-pressure may be eliminated via an offset process on the low frequency components in an acoustic filter installed between both speakers, thereby having the vibration of the vibrating plate go on smoothly and improving the low frequency characteristic of the stereo speakers.

Figure 4:
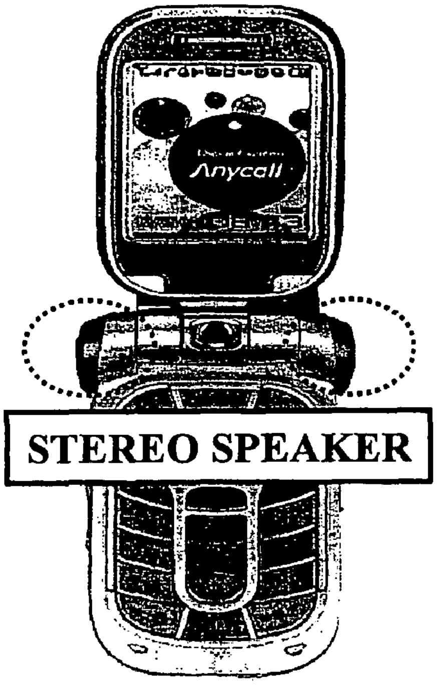
FIG. 4, parts i) and ii), is a diagram illustrating an example of concretely embodying the stereo speaker system according to the present invention.
Figure 4:
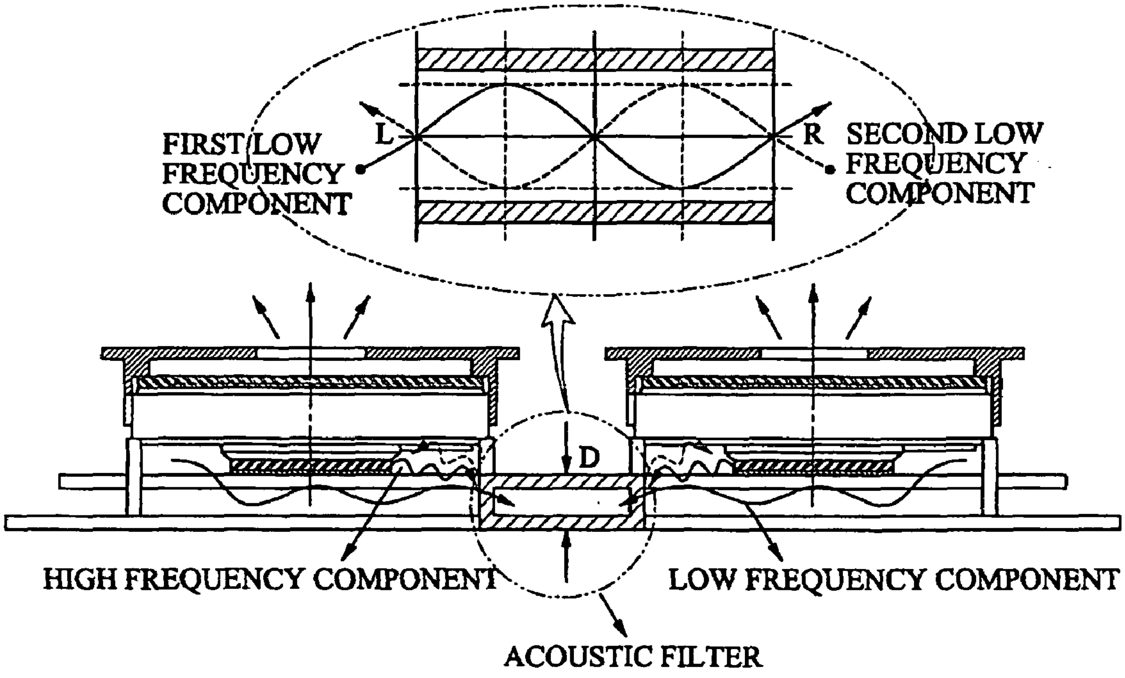

FIG. 4, parts i) and ii), is a diagram illustrating a detailed example of the embodiment of the stereo speaker system according to the present invention.

Figure 3:
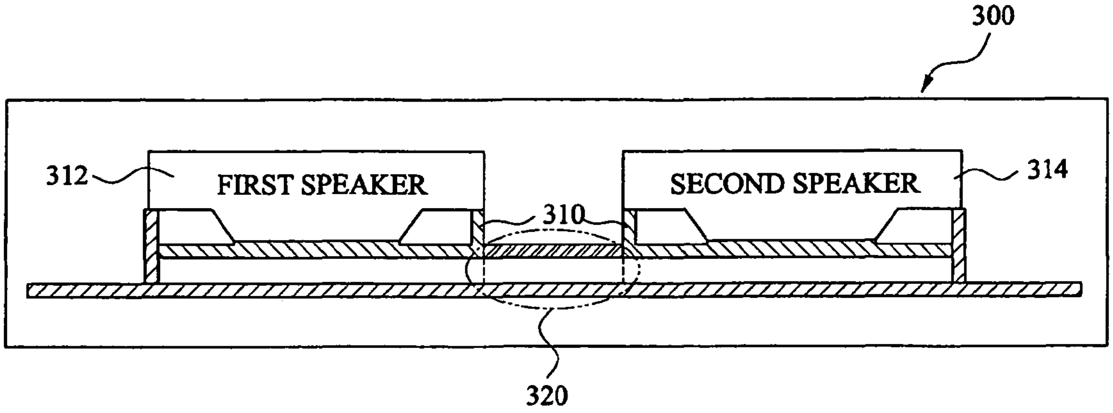
FIG. 3 a configuration diagram illustrating a speaker system according to an embodiment of the present invention.

Referring to FIGS. 3 and 4, when stereo speakers are installed in a mobile communication terminal too slim to secure a sufficient size of a rear cavity, the stereo speaker system 300 of the present embodiment employs, connected between the first speaker 312 and the second speaker 314, the filter unit 320 that is an orifice tube (an acoustic filter).

In this case, the first speaker 312 and the second speaker 314 are installed to be separated from each other by a predetermined distance in a mobile communication terminal as shown in part i) of FIG. 4, and stereo audio service may be provided by the plurality of the speakers 312 and 314. The separation distance between the plurality of the speakers 312 and 314 may be different according to the mobile communication terminals in which speakers are installed. For example, as shown in part i) of FIG. 4, the speakers 312 and 314 are installed at two points symmetrical with each other based on the center axle of the mobile communication terminal, thereby providing optimal stereo audio service.

In the stereo speaker system 300, in the case low frequency components of audio is not eliminated due to the volume of the rear cavity, the low frequency components of the audio is completely eliminated in the filter unit 320.

In this case, the filter unit 320 cuts off high-frequency components of the audio from audio outputted at a resonance frequency from the speakers 312 and 314 and allows the reception of low frequency components affecting the low frequency characteristic of the speakers 312 and 314.

Accordingly, a process of offsetting low frequency components of both speakers 312 and 314 is performed and the low frequency component is completely eliminated in the filter unit 320.

In part ii) of FIG. 4, first and second low frequency components received by both inlets of the filter unit 320 are illustrated. It is assumed that the first low frequency component is received by the first inlet L of the filter unit 320 and the second low frequency component is received by the second inlet R. The first and second low frequency components moves as a waveform shown in ii) of FIG. 4 and progress in the filter unit 320, and two low frequency components are offset and eliminated due to mutual interference between the low frequency components in the filter unit 320.

Also, the filter unit 320 may determine the diameter D of the filter unit 320 according to a resonance frequency outputting audio in the speakers 312 and 314. For example, the diameter D may be extended as the resonance frequency gets bigger to receive low frequency components of audio whose frequency is increased according to an increase of a resonance frequency of audio.

According to the above-described embodiments of the present invention, though in the case a mobile communication terminal is too slim to secure a sufficient volume of a rear cavity, the occurrence of back-pressure may be controlled by inducing the elimination of low frequency components by an acoustic filter and an air-loading phenomenon is removed accordingly, thereby improving low frequency characteristic of the stereo speakers.

Also, according to the above-described embodiments of the present invention, there is provided a stereo speaker system in which though stereo speakers are installed in a mobile communication terminal too slim to secure a sufficient rear cavity, low frequency components may be eliminated via an offset process in a filter and low frequency characteristic of the stereo speakers may be improved by controlling the occurrence of back-pressure.

Further, according to the above-described embodiments of the present invention, there is also provided a stereo speaker system, in which the diameter of a filter eliminating low frequency components of audio may be determined based on a resonance frequency of audio outputted from stereo speakers, so that low frequency components whose frequency is changed can enter the filter smoothly.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A stereo speaker system for a mobile device comprising: a speaker unit having a plurality of speakers which output audio; and a filter unit selectively receiving low frequency components of the outputted audio, and eliminating the received low frequency components to decrease back pressure on the speakers, wherein the filter unit is an orifice tube that is located between the plurality of speakers and connects the speakers of the plurality, wherein a diameter and the volume of the orifice tube are determined based on resonance frequency of the audio, and wherein the plurality of speakers includes first and second speakers, and the filter unit receives a first low frequency component from the first speaker, receives a second low frequency component from the second speaker, and offsets the first low frequency component and the second low frequency component to eliminate the low frequency component of the audio.

2. The system of claim 1, wherein a structure of the orifice tube is determined based on resonance frequency of the audio.

3. The system of claim 1, wherein the plurality of speakers increases a vibrating force of a vibrating plate as the back pressure decreases.

* * * * *

UNITED STATES PATENT AND TRADEMARK OFFICE
CERTIFICATE OF CORRECTION

PATENT NO. : 7,957,545 B2
APPLICATION NO. : 11/316860
DATED : June 7, 2011
INVENTOR(S) : Young Tae Kim et al.

It is certified that error appears in the above-identified patent and that said Letters Patent is hereby corrected as shown below:

Column 8, Line 2-21, In claim 1, delete "A stereo speaker system for a mobile device comprising:
a speaker unit having a plurality of speakers which output audio; and
a filter unit selectively receiving low frequency components of the outputted audio, and eliminating the received low frequency components to decrease back pressure on the speakers,
wherein the filter unit is an orifice tube that is located between the plurality of speakers and connects the speakers of the plurality,
wherein a diameter and the volume of the orifice tube are determined based on resonance frequency of the audio, and
wherein the plurality of speakers includes first and second speakers, and the filter unit receives a first low frequency component from the first speaker, receives a second low frequency component from the second speaker, and offsets the first low frequency component and the second low frequency component to eliminate the low frequency component of the audio."
and insert -- A stereo speaker system for a mobile device comprising:
a speaker unit having a plurality of speakers which output audio; and
a filter unit selectively receiving low frequency components of the outputted audio, and eliminating the received low frequency components to decrease back pressure on the speakers,
wherein the filter unit is an orifice tube that is located between the plurality of speakers and connects the speakers of the plurality,
wherein a diameter and the volume of the orifice tube are determined based on resonance frequency of the audio, and
wherein the plurality of speakers includes first and second speakers, and the filter unit receives a first low frequency component from the first speaker, receives a second low frequency component from the second speaker, and offsets the first low frequency component and the second low frequency component to eliminate the low frequency component of the audio. --, therefor.

Signed and Sealed this
Twenty-eighth Day of February, 2012

David J. Kappos

David J. Kappos
*Director of the United States Patent and Trademark Office*